(12) United States Patent
Demirer et al.

(10) Patent No.: US 11,221,561 B2
(45) Date of Patent: Jan. 11, 2022

(54) SYSTEM AND METHOD FOR WAFER-BY-WAFER OVERLAY FEEDFORWARD AND LOT-TO-LOT FEEDBACK CONTROL

(71) Applicant: KLA Corporation, Milpitas, CA (US)

(72) Inventors: Onur Nihat Demirer, Houston, TX (US); Fatima Anis, Milpitas, CA (US); Mark D. Smith, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 42 days.

(21) Appl. No.: 16/742,209

(22) Filed: Jan. 14, 2020

(65) Prior Publication Data
US 2021/0216021 A1 Jul. 15, 2021

(51) Int. Cl.
G03F 7/20 (2006.01)
(52) U.S. Cl.
CPC ...... G03F 7/70633 (2013.01); G03F 7/70525 (2013.01)
(58) Field of Classification Search
CPC ............... G03F 7/70633; G03F 7/70525
See application file for complete search history.

(56) References Cited

U.S. PATENT DOCUMENTS

| 2004/0159397 A1* | 8/2004 | Bode ............... G03F 7/70525 156/345.5 |
| 2010/0085548 A1 | 4/2010 | Bilsen |
| 2016/0062250 A1* | 3/2016 | Hung ................ G03F 7/70633 355/67 |
| 2017/0322021 A1 | 11/2017 | Takagi et al. |
| 2018/0253016 A1 | 9/2018 | Demirer et al. |
| 2019/0179231 A1 | 6/2019 | Laske et al. |
| 2019/0339211 A1 | 11/2019 | Huijgen et al. |

OTHER PUBLICATIONS

PCT International Search Report and Written Opinion for International Application No. PCT/US2020/012388 dated Apr. 26, 2021, 7 pages.

* cited by examiner

*Primary Examiner* — Steven Whitesell Gordon
(74) *Attorney, Agent, or Firm* — Suiter Swantz pc llo

(57) ABSTRACT

An overlay control system is disclosed. In embodiments, the system may include a controller configured to: acquire a set of feedback overlay measurements based on a plan of record (POR) sampling map on a second layer of samples of at least one previous lot of samples; generate a reference wafer overlay map based on the set of feedback overlay measurements; acquire a set of feedforward overlay measurements based on a feedforward sampling map on a first layer of a set of samples of a current lot of samples; generate a set of artificial overlay vector maps for the set of samples of the current lot of samples based on the set of feedforward overlay measurements; and cause a lithography tool to fabricate a second layer of samples of the current lot of samples based on the reference wafer overlay map and the set of artificial overlay vector maps.

19 Claims, 10 Drawing Sheets

SYSTEM AND METHOD FOR WAFER-BY-WAFER OVERLAY FEEDFORWARD AND LOT-TO-LOT FEEDBACK CONTROL

TECHNICAL FIELD

The present disclosure is directed generally to overlay control systems and, more particularly, to overlay control systems with wafer-to-wafer feedforward control and lot-to lot feedback control.

BACKGROUND

Semiconductor devices typically include a stack of patterned layers formed from a series of processing steps including deposition, lithographic exposure of a desired pattern, and etching exposed or unexposed portions. The exposure step for a given layer is typically divided into a grid of exposure fields such that a lithography tool separately exposes each field.

Lithography overlay represents the alignment error, or misregistration, between two or more layers. Overlay errors may result from various sources such as systematic bias from fabrication tools (e.g., lithography tools), stochastic errors, sample geometry-induced errors (e.g., induced errors), or sample variations. Further, overlay errors may vary systematically or randomly across a sample for each exposure field. Overlay errors are typically mitigated and/or compensated for during production by tightly controlling the configuration of the lithography tool for each exposure field. For example, the lithography tool may align the reticle to the sample based on measurements of alignment targets already fabricated on the sample. Further, the lithography tool may employ additional overlay corrections based on overlay measurements of overlay targets.

As the dimensions of semiconductor devices (wafers, samples) continue to decrease, so too do the acceptable overlay errors. One of the primary methods used to shrink the dimensions of semiconductor devices is the use of "multiple patterning" (e.g., double patterning, quadruple patterning, and the like). These methods may enable the fabrication of devices which are smaller than single patterning lithography resolution. However, the number of lithography steps utilized in multiple patterning techniques is significantly increased, and the overlay between the multiple lithography steps becomes more critical. In the case of double patterning, two lithography steps may be performed to obtain a device structure that is half the size of the smallest device achievable by a single lithography step. However, the acceptable overlay error for the double patterning steps is half that of single patterning lithography. Accordingly, the shrinking size of semiconductor devices and use of multiple patterning techniques necessitates the need for tighter overlay control. Therefore, it may be desirable to provide systems and methods for providing stable overlay control for multiple configurations of alignment and overlay reference layers.

SUMMARY

An overlay control system is disclosed. In embodiments, the system may include a controller including one or more processors, the one or more processors configured to execute a set of program instructions stored in memory, the set of program instructions configured to cause the one or more processors to: acquire a set of feedback overlay measurements based on a plan of record (POR) sampling map on a second layer of one or more samples of at least one previous lot of samples; generate a reference wafer overlay map based on the set of feedback overlay measurements; acquire a set of feedforward overlay measurements based on a feedforward sampling map on a first layer of a set of samples of a current lot of samples; generate a set of artificial overlay vector maps for the set of samples of the current lot of samples based on the set of feedforward overlay measurements; and generate one or more control signals configured to cause the lithography tool to fabricate a second layer of one or more samples of the current lot of samples based on the reference wafer overlay map and the set of artificial overlay vector maps.

An overlay control system is disclosed. In embodiments, the system includes a lithography tool. In additional embodiments, the system includes a controller communicatively coupled to the lithography tool, the controller configured to: acquire a set of feedback overlay measurements based on a plan of record (POR) sampling map on a second layer of one or more samples of an at least one previous lot of samples; generate a reference wafer overlay map based on the set of feedback overlay measurements; acquire a set of feedforward overlay measurements based on a feedforward sampling map on a first layer of a set of samples of an current lot of samples; generate a set of artificial overlay vector maps for each sample of the current lot of samples based on the set of feedforward overlay measurements; and generate one or more control signals configured to cause the lithography tool to fabricate a second layer of each sample of the current lot of samples based on the reference wafer overlay map and the set of artificial overlay vector maps.

A method for feedforward and feedback overlay control is disclosed. In embodiments, the method includes: acquiring a set of feedback overlay measurements based on a plan of record (POR) sampling map on a second layer of one or more samples of at least one previous lot of samples; generating a reference wafer overlay map based on the set of feedback overlay measurements; acquiring a set of feedforward overlay measurements based on a feedforward sampling map on a first layer of a set of samples of a current lot of samples; generating a set of artificial overlay vector maps for the set of samples of the current lot of samples based on the set of feedforward overlay measurements; and generating one or more control signals configured to cause the lithography tool to fabricate a second layer of one or more samples of the current lot of samples based on the reference wafer overlay map and the set of artificial overlay vector maps.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
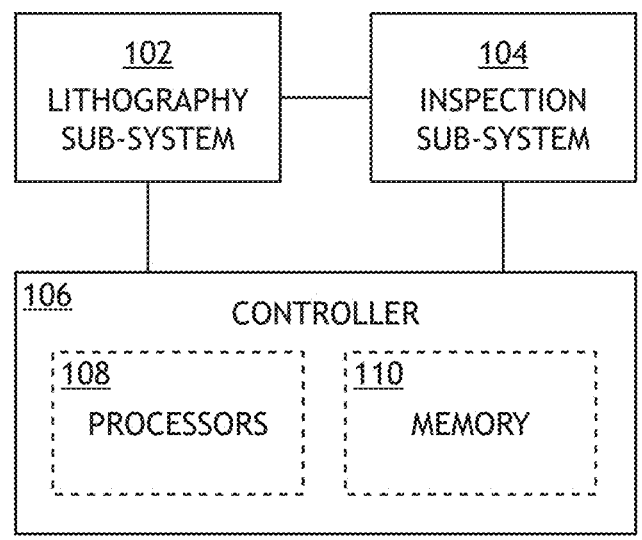
FIG. 1A illustrates a conceptual view of an overlay control system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Lithography overlay represents the alignment error, or misregistration, between two or more layers of a semiconductor device. Overlay errors may result from various sources such as systematic bias from fabrication tools (e.g., lithography tools), stochastic errors, sample geometry-induced errors (e.g., induced errors), or sample variations. As the dimensions of semiconductor devices (wafers, samples) continues to decrease, there is a need for tighter overlay control.

Some overlay control systems may utilize feedforward overlay controls in order to enable tighter overlay control. Feedforward overlay controls/corrections may be utilized to control/correct etch bias, reticle misregistration, and scanner matching. These feedforward techniques all aim to correct for systematic biases caused by specific processes or devices. However, conventional feedforward overlay controls typically rely on context information associated with each specific process or device (e.g., scanner ID, reticle ID, process tool ID), and have to calculate correct feedforward corrections from a lookup table. Thus, these conventional feedforward control techniques rely on storing correction terms to be applied to future lots, and not the acquired measurements themselves. These conventional feedforward control techniques tend to be "static" corrections which are periodically updated as new data is obtained in order to characterize the bias source.

Additionally, these conventional feedforward control techniques typically provide, at most, two feedforward overlay corrections per lot of samples (e.g., one feedforward overlay correction for each stage of the scanner used during lithography). Thus, these conventional control techniques offer limited utility in reducing and/or correcting wafer-by-wafer overlay variations within a single lot. Furthermore, conventional feedforward control techniques require a large number of overlay measurements to be acquired at each layer of a sample, thereby increasing the time required for overlay measurements, increasing metrology costs, and decreasing throughput.

Accordingly, embodiments of the present disclosure are directed to a system and method which cure one or more of the shortfalls of the previous approaches identified above. Embodiments of the present disclosure are directed to an overlay control system which utilizes wafer-by-wafer (sample-by-sample) feedforward and lot-by-lot feedback control to improve overlay control. The combined feedforward and feedback control of the present disclosure may reduce overlay between two layers of a sample, while simultaneously reducing the amount of time required for metrology processes. Additional embodiments of the present disclosure are directed to an overlay control method utilizing both wafer-by-wafer feedforward and lot-by-lot feedback control.

FIG. 1A illustrates a conceptual view of an overlay control system 100, in accordance with one or more embodiments of the present disclosure. The overlay control system 100 may include, but is not limited to, a lithography sub-system 102, an inspection sub-system 104, and a controller 106 including one or more processors 108 and a memory 110.

In one embodiment, the overlay control system 100 includes a lithography sub-system 102 for lithographically exposing one or more patterns (e.g., device patterns, metrology patterns, or the like) on a sample. The lithography sub-system 102 may include any lithography tool known in the art including, but not limited to, a scanner, a stepper, and the like.

In another embodiment, the inspection sub-system 104 may characterize one or more printed patterns on the sample such as, but not limited to, metrology targets (e.g., alignment and/or overlay targets). By way of another example, the inspection sub-system 104 may characterize a pattern mask (e.g., a reticle including a pattern of device elements to be exposed onto a sample by the lithography sub-system 102). In a general sense, the inspection sub-system 104 may measure any metrology metric (e.g., overlay error, pattern placement error, dimensions of sample features, critical dimensions (CD), sidewall angle, or the like) using any method known in the art. Further, the inspection sub-system 104 may measure metrology metrics based on any technique known in the art. In one embodiment, the inspection sub-system 104 includes an image-based metrology tool to measure metrology data based on the generation of one or more images of the sample (e.g., by directly imaging portions of the sample, by pointwise scanning, or the like). In another embodiment, the inspection sub-system 104 includes a scatterometry-based metrology system to measure metrology data based on the scattering (reflection, diffraction, diffuse scattering, or the like) of light from the sample (e.g. a wafer, a pattern mask, or the like).

In embodiments, the lithography sub-system 102 and/or inspection sub-system 104 may be communicatively coupled to one another and/or the controller 106. In another embodiment, controller 106 includes one or more processors 108 configured to execute a set of program instructions maintained in memory 110, the set of program instructions configured to cause the one or more processors 108 to carry out the various steps/functions of the present disclosure. In this regard, the one or more processors 108 of controller 106 may execute any of the various process steps described throughout the present disclosure. For example, the controller 106 may be configured to generate feedforward control signals and feedback control signals in order to enable tighter overlay control of a sample.

It is noted herein that the one or more components of system 100 may be communicatively coupled to the various other components of system 100 in any manner known in the art. For example, the lithography sub-system 102, inspection sub-system 104, and controller 106 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth, 3G, 4G, 4G LTE, 5G, and the like).

In one embodiment, the one or more processors 108 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 108. In general, the term "processor" may be broadly defined to encompass any device having one or more processing elements, which execute program instructions from memory 110. Moreover, different subsystems of the system 100 (e.g., lithography sub-system 102, inspection sub-system 104, controller 106) may include processor or logic elements suitable for carrying out at least a portion of the steps described throughout the present disclosure. Therefore, the above description should not be interpreted as a limitation on the present disclosure but merely an illustration.

The memory 110 may include any storage medium known in the art suitable for storing program instructions executable by the associated one or more processors 108. For example, the memory 110 may include a non-transitory memory medium. For instance, the memory 110 may include, but is not limited to, a read-only memory (ROM), a random-access memory (RAM), a magnetic or optical memory device (e.g., disk), a magnetic tape, a solid-state drive and the like. In another embodiment, the memory 110 is configured to store data received from the lithography sub-system 102 and/or inspection sub-system 104. It is further noted that memory 110 may be housed in a common controller housing with the one or more processors 108. In an alternative embodiment, the memory 110 may be located remotely with respect to the physical location of the processors 108, controller 106, and the like. In another embodiment, the memory 110 maintains program instructions for causing the one or more processors 108 to carry out the various steps described through the present disclosure.

In another embodiment, the system 100 may further include a user interface communicatively coupled to the controller 106. In one embodiment, the user interface may include, but is not limited to, one or more desktops, tablets, smartphones, smart watches, or the like. In another embodiment, the user interface includes a display used to display data of the system 100 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via the user interface.

Figure 1B:
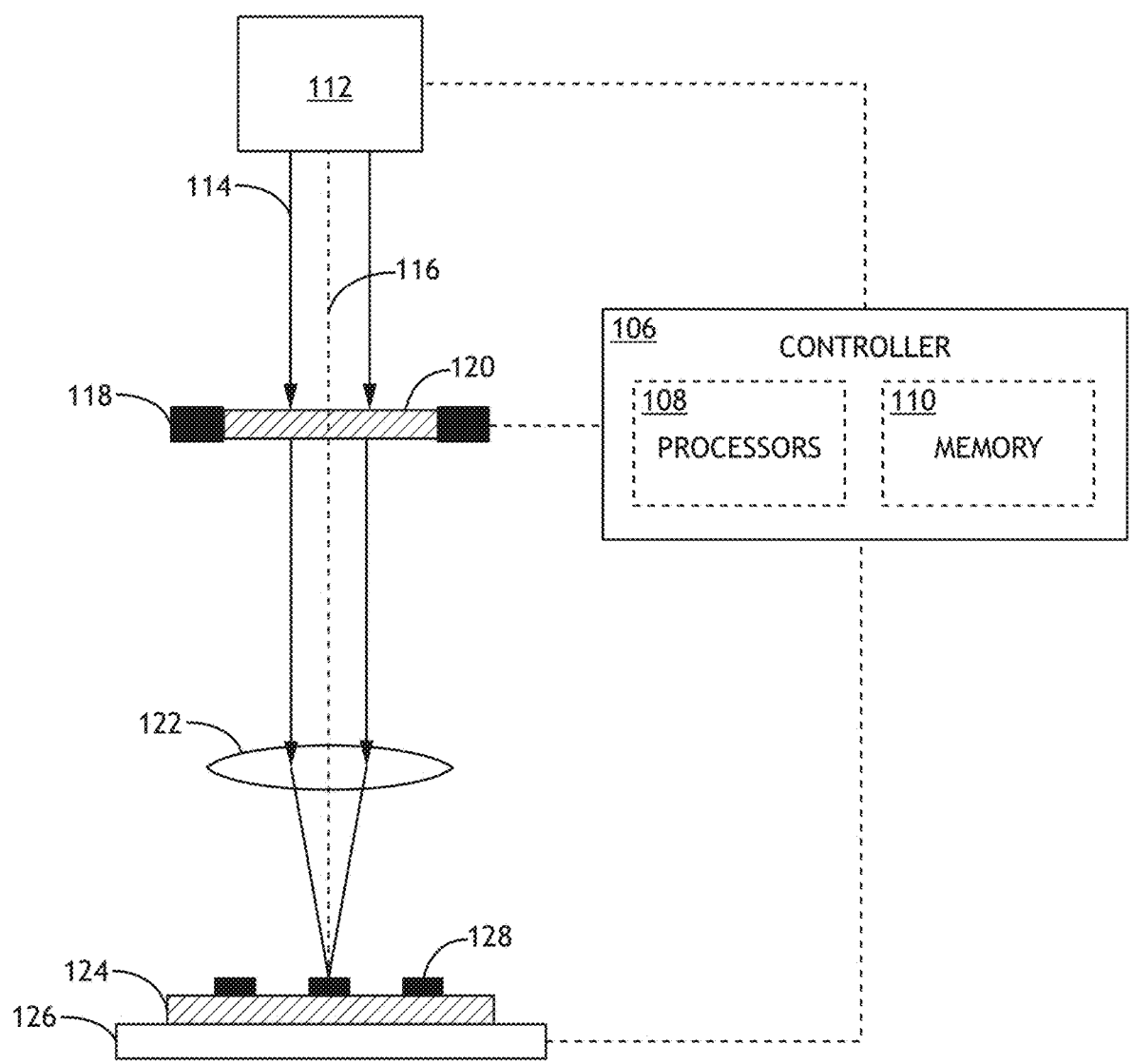
FIG. 1B illustrates a conceptual view of a lithography sub-system, in accordance with one or more embodiments of the present disclosure.

FIG. 1B illustrates a conceptual view of a lithography sub-system 102, in accordance with one or more embodiments of the present disclosure. In one embodiment, the lithography sub-system 102 includes a lithography illumination source 112 configured to generate one or more illumination beams 114. The one or more illumination beams 114 may include one or more selected wavelengths of light including, but not limited to, ultraviolet (UV) radiation, visible radiation, or infrared (IR) radiation.

The lithography illumination source 112 may include any type of illumination source known in the art suitable for generating an illumination beam 114. For example, the lithography illumination source 112 may include one or more laser systems (e.g., gas lasers, diode lasers, free-electron lasers, fiber lasers, disk lasers, or the like). By way of another example, the lithography illumination source 112 may include one or more lamp systems (e.g., arc lamps, or the like). By way of another example, the lithography illumination source 112 includes a plasma illumination source (e.g., a laser-pulsed plasma (LPP) source, a discharge pumped plasma (DPP) source, a laser-sustained plasma (LSP) source, or the like). The lithography illumination source 112 may additionally include any number of optical elements suitable for manipulating one or more aspects of the illumination beam 114 such as, but not limited to, filters, polarizers, waveplates, lenses, diffusers, mirrors, and the like.

The one or more illumination beams 114 generated by the lithography illumination source 112 may have any spatial distribution (e.g., illumination pattern) known in the art. For example, the lithography illumination source 112 may generate an on-axis illumination beam 114 in which illumination propagates along (or parallel to) an optical axis 116 and/or any number of off-axis illumination beams 114 in which illumination propagates at an angle to the optical axis 116.

In another embodiment, the lithography sub-system 102 includes a mask support device 118. The mask support device 118 is configured to secure a pattern mask 120 (e.g., a reticle) including a pattern of elements to be exposed during fabrication. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto on the resist layer 128 to expose the resist layer 128 and a subsequent etching step may remove the exposed material (e.g., positive etching) or the unexposed material (e.g., negative etching) in order to provide printed features on the sample 124.

As used throughout the present disclosure, the term "sample 124" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. The sample 124 may include one or more layers including, but not limited to, a resist, a dielectric material, a conductive material, and a semiconductor material. For the purposes of the present disclosure, the terms sample and wafer should be interpreted as interchangeable.

The controller 106 may be communicatively coupled to any number of elements in the lithography sub-system 102. For example, the controller 106 may be communicatively coupled to the mask support device 118, the lithography illumination source 112, and/or the sample stage 126 to direct the exposure of pattern elements on a pattern mask 120 to a sample 124 (e.g., a resist layer 128 on the sample, or the like). In this regard, exposure conditions such as the exposure dose, the focal position of the sample within the lithography sub-system 102, and the like may be adjusted.

Figure 1C:
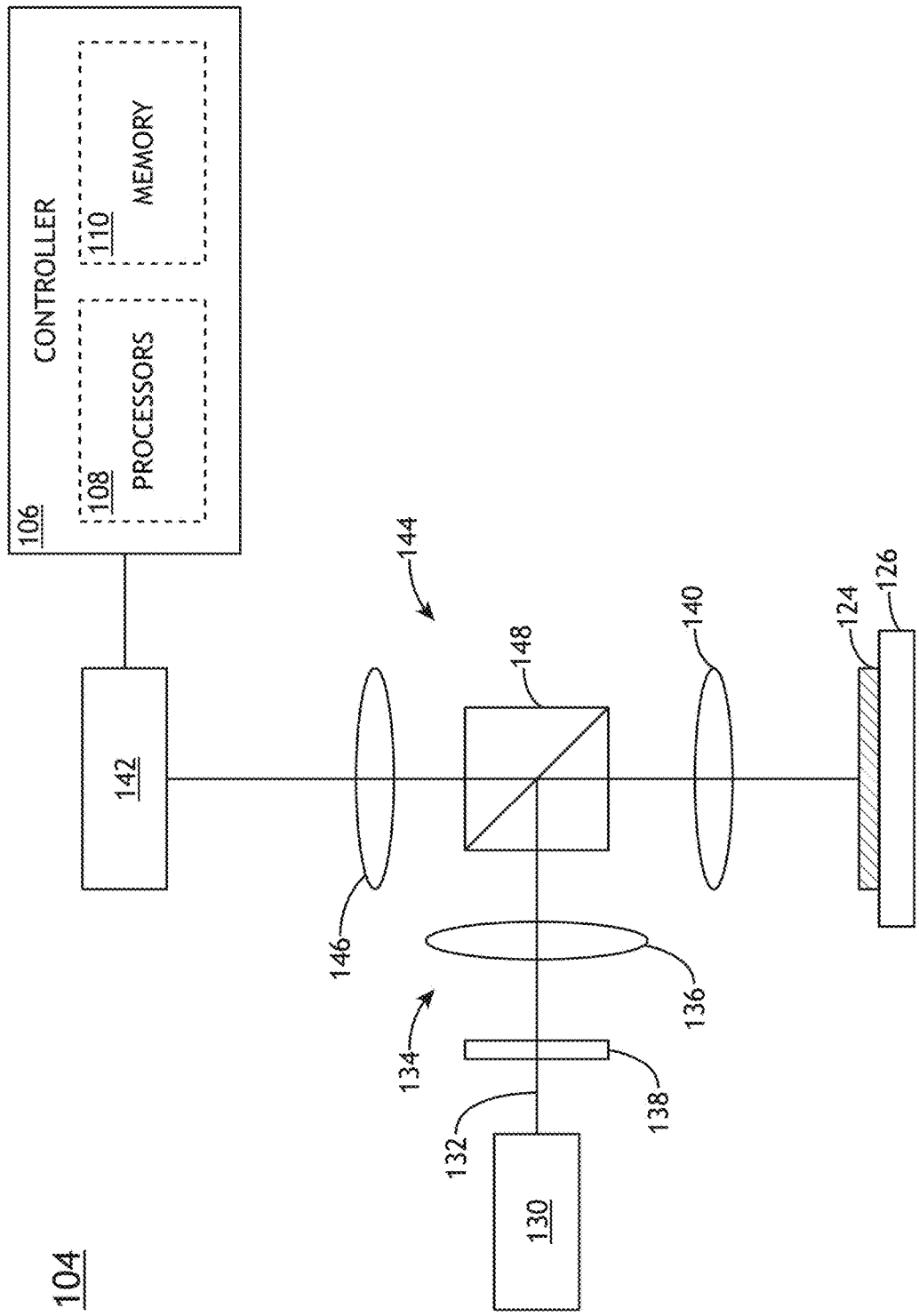
FIG. 1C illustrates a conceptual view of an inspection sub-system, in accordance with one or more embodiments of the present disclosure.

FIG. 1C illustrates a conceptual view of an inspection sub-system 104, in accordance with one or more embodiments of the present disclosure. The inspection sub-system 104 may include, but is not limited to, an illumination source 130 configured to direct an illumination beam 132 to a sample 124 along an illumination arm 134, and a detector assembly 142 configured to receive illumination emanating from the sample 124 along a collection arm 144.

In one embodiment, the inspection sub-system 104 includes an illumination source 130 to generate an illumination beam 132. It is noted herein that the lithography sub-system 102 may share an illumination source or may include separate illumination sources. In this regard, the illumination source 130 may be the same as the lithography illumination source 112, or may include a separate illumination source 130. The illumination beam 132 may include any type of illumination beam known in the art suitable for characterizing the sample 124. For example, the illumination beam 132 may include a beam of electromagnetic radiation having or more selected wavelengths including, but not limited to, X-ray wavelengths, ultraviolet (UV) wavelengths, visible wavelengths, or infrared (IR) wavelengths. By way of another example, the illumination beam 132 may include a particle beam such as, but not limited to, an electron beam, an ion beam, or a beam of neutral particles.

In another embodiment, the illumination source 130 is configured to direct the illumination beam 132 to the sample 124 via an illumination arm 134. As used throughout the present disclosure, the term "metrology sample" generally refers to an object to be inspected by the inspection sub-system 104. In this regard, the inspection sub-system 104 may operate as a wafer inspection system. By way of another example, the sample 124 may include a pattern mask (e.g. reticle). In this regard, the inspection sub-system 104 may operate as a reticle inspection system.

The illumination arm 134 may include one or more illumination pathway lenses 136, an objective lens 140 configured to focus the illumination beam 132 onto the sample 124, and one or more additional optical elements 138 suitable for modifying and/or conditioning the illumination beam 132. For example, the one or more optical elements 138 may include, but are not limited to, polarizers, filters, beam splitters, diffusers, homogenizers, apodizers, beam shapers, and the like. For example, as illustrated in FIG. 1C, the inspection sub-system 104 may include a beamsplitter 148 oriented such that the objective lens 140 may simultaneously direct the illumination beam 132 to the sample 124 and collect radiation emanating from the sample 124. In this regard, the inspection sub-system 104 may be configured in an epi-illumination mode.

In another embodiment, the angle of incidence of the illumination beam 132 on the sample 124 is adjustable. For example, the path of the illumination beam 132 through the beamsplitter 148 and the objective lens 140 may be adjusted to control the angle of incidence of the metrology illumination beam 132 on the sample 124. In this regard, the illumination beam 132 may have a nominal path through the beamsplitter 148 and the objective lens 140 such that the illumination beam 132 has a normal incidence angle on the sample 124. Further, the angle of incidence of the illumination beam 132 on the sample 124 may be controlled by modifying the position and/or angle of the illumination beam 132 on the beamsplitter 148 (e.g., by rotatable mirrors, a spatial light modulator, a free-form illumination source, or the like). In another embodiment, the illumination source 130 is configured to direct the one or more illumination beams 132 to the sample 124 at an angle (e.g., a glancing angle, a 45-degree angle, or the like). In this regard, the inspection sub-system 104 may be arranged in any configuration known in the art including, but not limited to, a dark-field configuration, a light-field configuration, and the like.

In another embodiment, the inspection sub-system 104 includes a detector assembly 142 configured to capture radiation (illumination) emanating from the sample 124 through a collection arm 144. The collection arm 144 may include one or more collection pathway lenses 146 or additional optical elements suitable for capturing and/or modifying the radiation emanating from the sample 124 including, but not limited to, lenses, filters, wave plates, mirrors, polarizers, beam blocks, and the like. It is noted that detector assembly 142 may include any sensor and detector assembly known in the art for detecting illumination reflected or scattered from the sample 124. For example, a detector assembly 142 may include, but is not limited to, a CCD detector, a TDI detector, a photomultiplier tube (PMT), an avalanche photodiode (APD), or the like. In another embodiment, a detector assembly 142 may include a spectroscopic detector suitable for identifying wavelengths of radiation emanating from the sample 124. In another embodiment, the inspection sub-system 104 may include multiple detectors 142 (e.g. associated with multiple beam paths generated by one or more beamsplitters to facilitate multiple metrology measurements (e.g. multiple metrology tools) by the inspection sub-system 104.

In another embodiment, the detector assembly 142 of the inspection sub-system 104 is configured to collect metrology data of the sample 124 based on illumination reflected or scattered from the sample 124. In another embodiment, the detector assembly 142 is configured to transmit collected/acquired images and/or metrology data to the controller 106.

Figure 2:
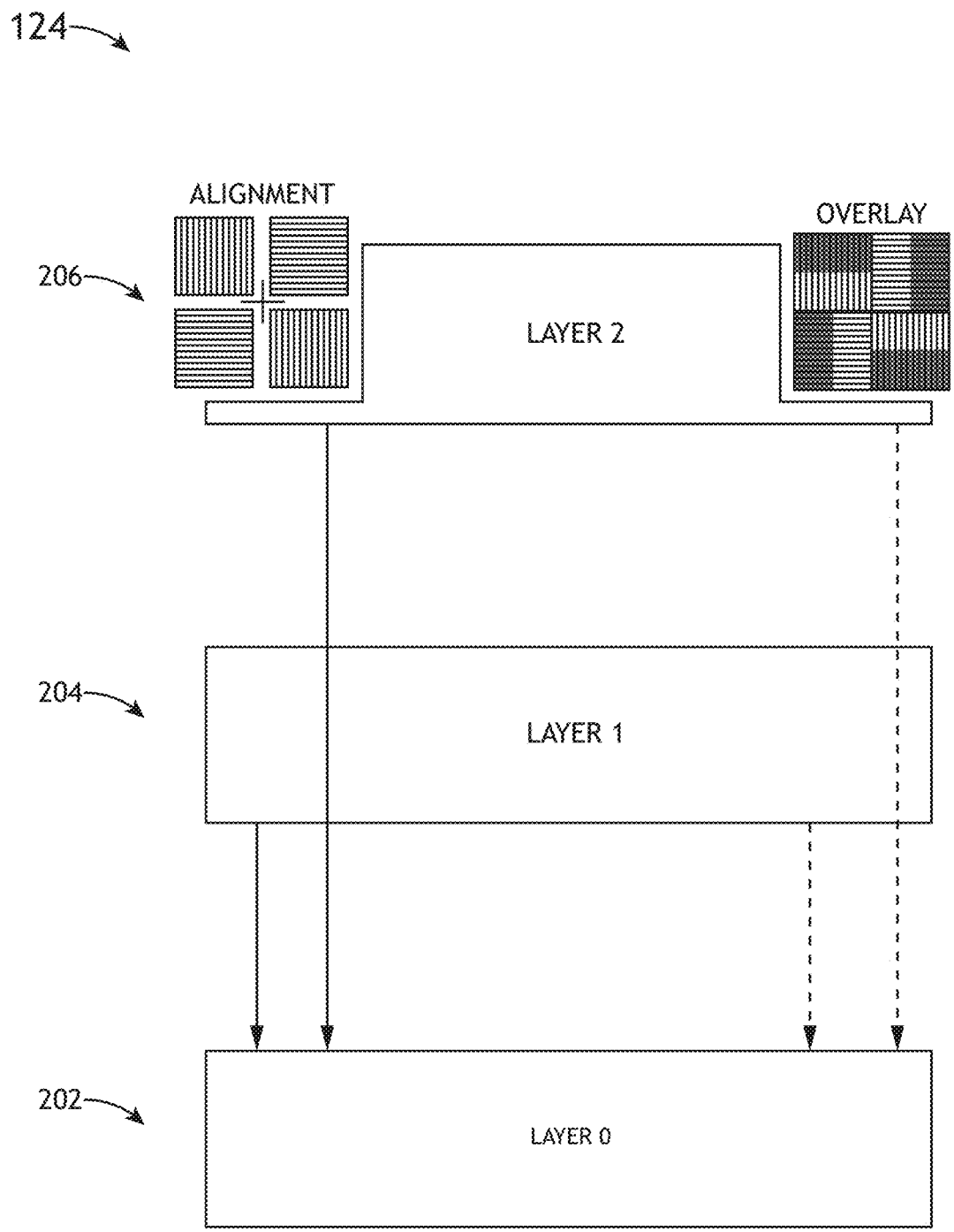
FIG. 2 illustrates a simplified conceptual diagram of a sample, in accordance with one or more embodiments of the present disclosure.

FIG. 2 illustrates a simplified conceptual diagram of a sample 124, in accordance with one or more embodiments of the present disclosure. A sample 124 may include, but is not limited to, a reference layer 202, a first layer 204, and a second layer 206.

Embodiments of the present disclosure may be directed to a system and method configured to minimize overlay errors between two layers which measure overlay to a same reference layer. For example, as shown in FIG. 2, a sample 124 may include a reference layer 202 (e.g., "Layer 0"), a first layer 204 (e.g., "Layer 1"), and a second layer 206 (e.g., "Layer 2"). As it applies to this disclosure, system 100 may be configured to measure overlay of the first layer 204 and the second layer 206 relative to the reference layer 202.

It is noted herein that there may be few process steps with large variations between lithography steps used to fabricate the first layer 204 and the second layer 206. It is further noted herein that conventional overlay measurement techniques may require large amounts of overlay measurements between the second layer 206 and the reference layer 202. However, overlay measurements between the second layer 206 and the reference layer 202 may be challenging and time-consuming to acquire, thereby increasing overlay measurement times and decreasing throughput. Accordingly, some embodiments of the present disclosure are directed toward reducing wafer-by-wafer (sample-by-sample) variations and reducing measurement times by utilizing overlay measurements of the first layer 204 to facilitate overlay measurements of the second layer 206. In particular, overlay measurements of the first layer 204 may be utilized in a feedforward control scheme to facilitate overlay measurements at the second layer 206. This will be described in further detail herein with respect to FIG. 3.

As noted previously herein, the one or more processors 108 may be configured to execute a set of program instructions stored on memory 110, the set of program instructions configured to cause the one or more processors 108 to carry out various functions and steps of the present disclosure. In this regard, the controller 106 may be configured to: acquire a set of feedforward overlay measurements based on a feedforward sampling map on a first layer of a first set of samples of a lot of samples; generate a set of artificial overlay vector maps for the first set of samples based on the set of feedforward overlay measurements; generate one or more control signals configured to cause a lithography tool to fabricate a second layer of one or more samples of the lot of samples to form one or more reference samples; acquire a set of feedback overlay measurements based on a plan of record (POR) sampling map on the second layer of the one or more reference samples; generate a reference wafer overlay map based on the set of feedback overlay measurements; and generate one or more control signals configured to cause the lithography tool to fabricate a second layer of the lot of samples based on the reference wafer overlay map and the set of artificial overlay vector maps.

Each of the steps/functions of the controller 106 may be further shown and described with reference to FIG. 3.

Figure 3:
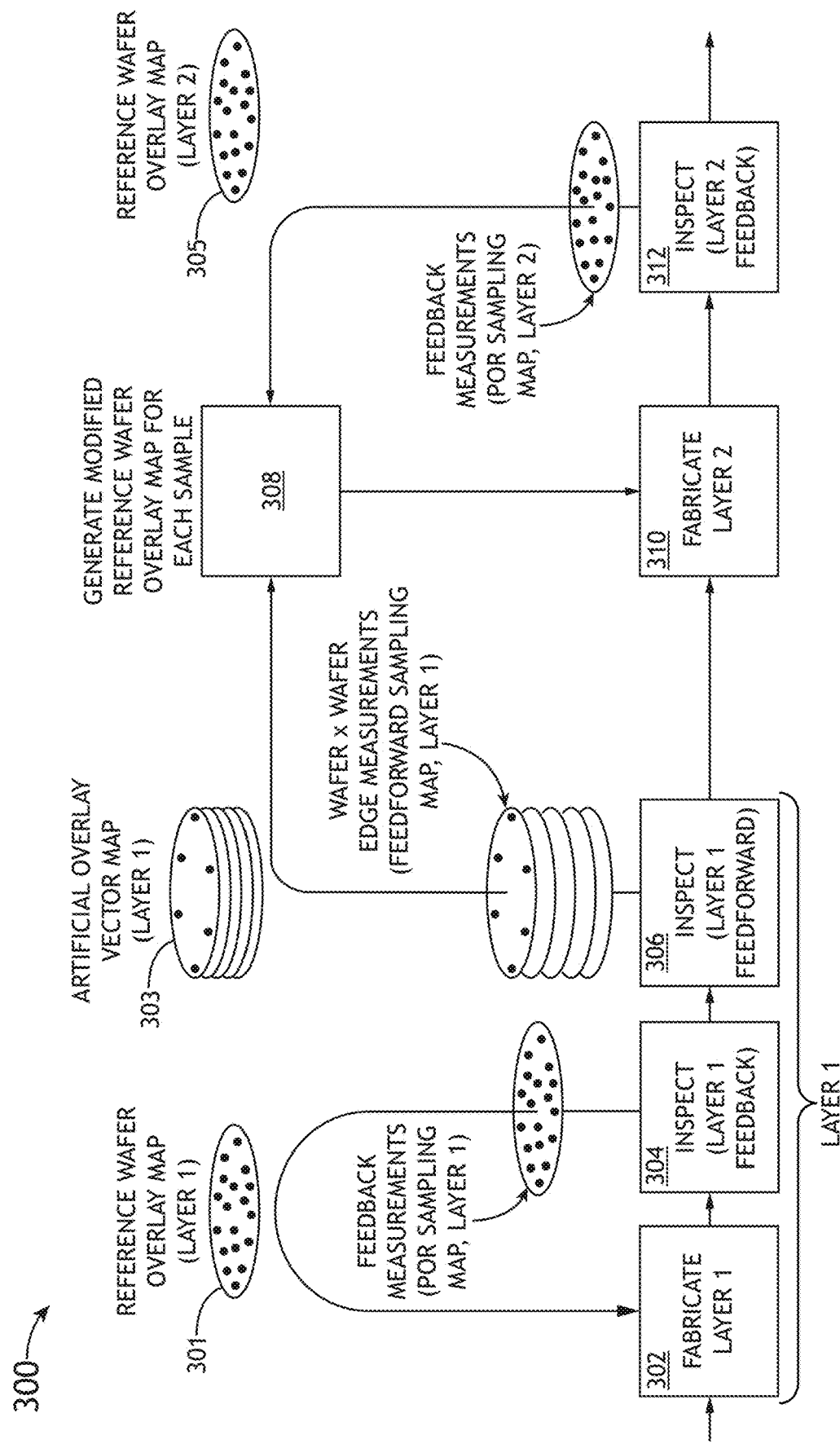
FIG. 3 illustrates a flow diagram of an overlay control method including wafer-by-wafer feedforward and lot-by-lot feedback control, in accordance with one or more embodiments of the present disclosure.

FIG. 3 illustrates a flow diagram of an overlay control method 300 including wafer-by-wafer feedforward and lot-by-lot feedback control, in accordance with one or more embodiments of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300.

In a step 302, a first layer 204 of a sample 124 may be fabricated. For example, the controller 106 may be configured to generate control signals configured to cause one or more lithography tools of the lithography sub-system 102 to fabricate the first layer 204 on each sample 124 of the lot of samples. The term "lot of samples" may refer to any group of one or more samples 124 which are being inspected and/or fabricated. For example, during a semiconductor device (sample 124) fabrication process, the samples 124 may be fabricated in "lots" of between approximately two and twenty-five samples 124. For instance, in a first lot of samples which includes twenty-five samples 124, the controller 106 may cause the lithography sub-system 102 to fabricate a first layer 204 on each of the twenty-five samples 124 of the first lot of samples in step 302.

In a step 304, one or more samples 124 of the lot of samples fabricated in step 302 are inspected for feedback control. For example, the controller 106 may cause the inspection sub-system 104 to acquire a plurality of measurements (e.g., feedback overlay measurements) and/or images of one or more samples 124, and may receive the measurements and/or images from the inspection sub-system 104. The controller 106 may additionally and/or alternatively receive the one or more feedback overlay measurements from any source known in the art including, but not limited to, memory 110, a network, and the like. The feedback overlay measurements collected in step 304 may be overlay measurements measuring overlay error on the one or more inspected samples 124 between the first layers 204 and the reference layers 202 of the respective samples 124.

It is noted herein that the term "feedback overlay measurements" may refer to one or more overlay measurements of the sample 124 which will be used for feedback control and/or correction. Conversely, the term "feedforward overlay measurements" may refer to one or more overlay measurements of the sample 124 which will be used for feedforward control and/or correction.

In embodiments, the controller 106 may cause the inspection sub-system 104 (or other image/measurement source) to acquire the feedback overlay measurements in step 304 based on a plan of record (POR) sampling map. This may be further understood with reference to FIG. 4.

Figure 4:
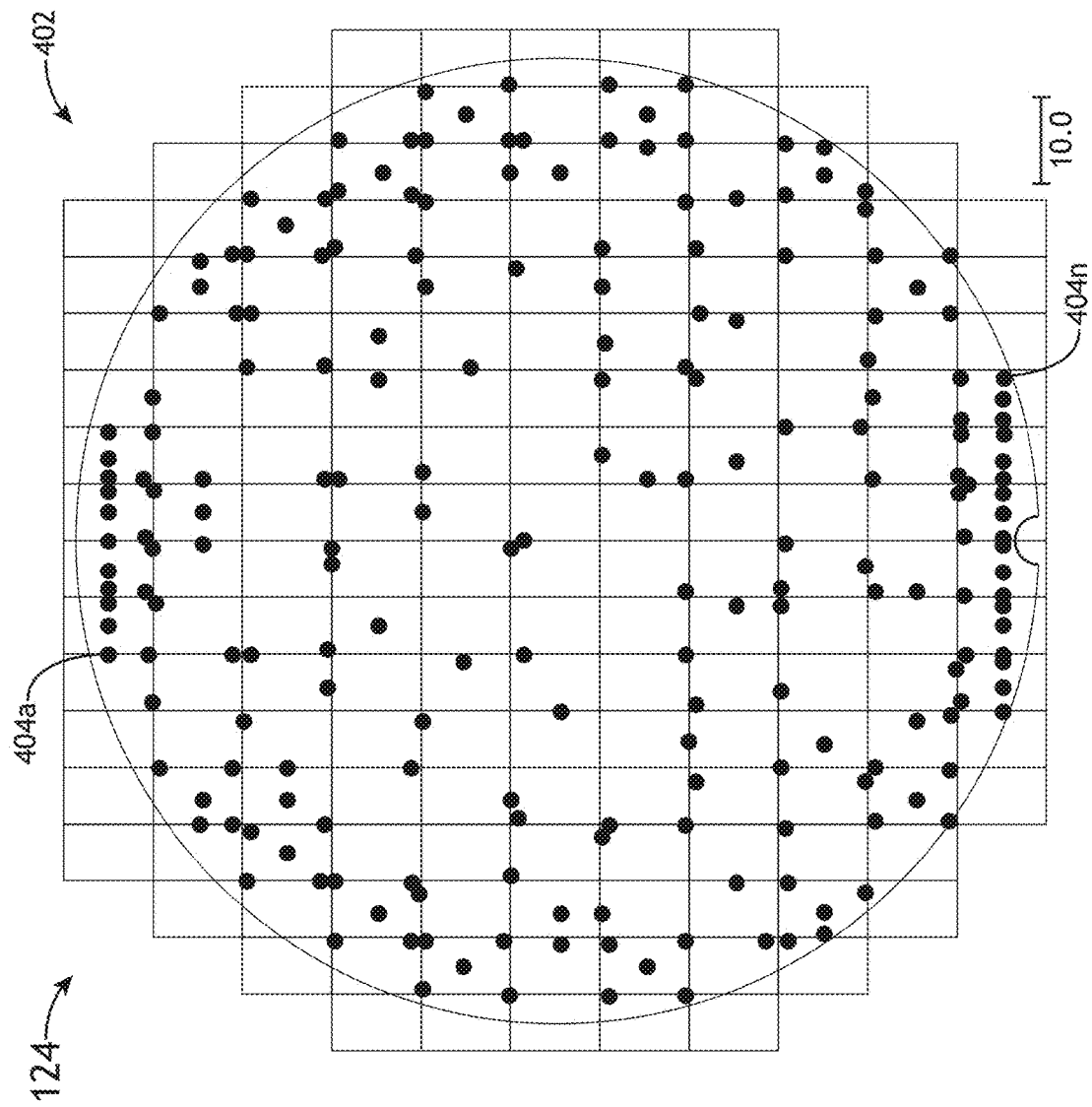
FIG. 4 illustrates a plan of record (POR) sampling map of a sample, in accordance with one or more embodiments of the present disclosure.

FIG. 4 illustrates a plan of record (POR) sampling map 402 of a sample 124, in accordance with one or more embodiments of the present disclosure. In embodiments, a POR sampling map 402 may define a plurality of points 404a-404n where feedback overlay measurements are to be collected/acquired on the sample 124. For example, in step 304, the controller 106 may acquire feedback overlay measurements between the first layer 204 and the reference layer 202 at each of the points 404a-404n defined by the POR sampling map 402. In particular, in step 304, the controller 106 may acquire feedback overlay measurements based on the POR sampling map 402 for one or more samples fabricated in step 302.

The number and/or orientation of the points 404a-404n within the POR sampling map 402 may be automatically and/or manually selected. In some embodiments, the POR sampling map 402 may include a sparse sampling map with approximately two-hundred to five-hundred points 404a-404n. For example, the POR sampling map 402 may include a plurality of points 404a-404n which are dispersed across the entirety of each sample 124. For instance, as shown in FIG. 4, the POR sampling map 402 may include 220 points 404a-404n which are arranged to form a sparse sampling map near the center of the sample 124, and a denser sampling map near the edges of the sample 124. The points 404a-404n of the POR sampling map 402 may be selected such that they correspond with important features or locations on the sample 124 for which overlay errors are to be monitored.

After acquiring the feedback overlay measurements of the reference samples in step 304, the controller 106 may be configured to generate a reference wafer overlay map 301 of the first layer 204 (Layer 1) based on the acquired feedback overlay measurements. In embodiments, the reference wafer overlay map 301 of the first layer 204 (Layer 1) which is generated based on measurements of a lot of samples may be used to fabricate the first layer 204 on a subsequent lot of samples. In this regard, the reference wafer overlay map 301 may be used for feedback control to fabricate the first layer 204 on subsequent lots of samples in order to carry out feedback overlay corrections.

For example, as it applies to a first lot of samples 124, the first layer 204 may be fabricated on each sample 124 of the first lot of samples in step 302. One or more samples 124 of the first lot of samples may then be inspected in step 304 based on the POR sampling map 402. The measurements of the first lot of samples may then be used to generate a first reference wafer overlay map 301 for the first layer 204. Subsequently, the first layer 204 may be fabricated on each sample 124 of a second lot of samples in step 302. When fabricating the first layer 204 for the second lot of samples, the controller 106 may cause the lithography sub-system 102 to fabricate the first layer 204 based at least in part on the reference wafer overlay map 301 formed based on feedback measurements of the first lot. Similarly, in step 304 for the second lot of samples, feedback measurements of the second lot of samples may be used to generate a second reference wafer overlay map 301 which will be used to fabricate the first layer 204 on the third lot of samples.

Generally speaking, a reference wafer overlay map 301 generated based on feedback measurements collected for an $N^{th}$ lot of samples may be used to provide feedback control when fabricating the $N+1^{th}$, $N+2^{th}$ ... $N+n^{th}$ lot of samples 124. In other words, a reference overlay map 301 used for a current lot of samples may be generated based on feedback overlay measurements collected on one or more previous lots of samples. For example, a reference overlay map 301 used for an $N^{th}$ lot of samples may be generated based on feedback overlay measurements acquired on an $N-1^{th}$ lot of samples (first previous lot of samples), an $N-2^{th}$ lot of samples (second previous lot of samples), and an $N-3^{th}$ lot of samples (third previous lot of samples). The reference wafer overlay map 301 generated in step 304 may represent the overlay signatures of the lot of samples seen in high-volume manufacturing. Additionally, the use of the reference wafer overlay map 301 to fabricate the first layer 204 of subsequent lots of samples may facilitate the determination of rework on-product overlay (OPO).

Unless noted otherwise herein, the term "$N^{th}$ lot of samples" may be used to refer to the "current" lot of samples (e.g., the lot of samples currently under inspection/fabrication). The term "$N-1^{th}$ lot of samples," and like terms, may be used to refer to "previous" lots of samples (e.g., lots of samples previously fabricated and/or inspected). Conversely, the term "$N+1^{th}$ lot of samples," and like terms, may be used to refer to "subsequent" lots of samples (e.g., lots of samples which are to be fabricated and/or inspected following the current lot of samples).

Some embodiments of the present disclosure are directed toward collecting overlay measurements (e.g., feedback overlay measurements, feedforward overlay measurements) at locations on the sample 124 (e.g., points 404) which exhibit the highest wafer-to-wafer overlay variation. In this regard, the controller 106 may be configured to identify the points 404 on the sample 124 which exhibit the highest wafer-to-wafer variation. In embodiments, the controller 106 may be configured to perform one or more principal component analysis (PCA) processes on the overlay data acquired in step 304 in order to determine the points 404 which exhibit the most wafer-to-wafer variation. The controller 106 may therefore be configured to reconstruct the variation of the overlay measurements from wafer to wafer by using the most dominant principal components in order to identify regions (e.g., points 404) of high variation. In embodiments, the controller 106 may be configured to identify regions (e.g., points 404) of high variation by evaluating the standard deviation of reconstructed overlay signatures at each target location (e.g., at each point 404).

By performing principal component analysis processes on overlay measurements collected on a plurality of samples 124, it has been found that the highest wafer-to-wafer overlay variation may be found closer to the edge of the sample 124 rather than closer to the center of the sample 124. In this regard, referring to FIG. 4, it has been found that the points 404a-404n with the highest wafer-to-wafer variation are more likely to be those positioned proximate to the edge of the sample 124. It is noted herein that the controller 106 may be configured to identify regions and/or points 404a-404n which exhibit the highest wafer-to-wafer variation using any techniques known in the art including, but not limited to, principal component analysis (PCA), root sum square (RSS) analysis, standard deviation analysis, process signature quantification (PSQ) analysis, and the like.

In order to enable efficient feedforward control and facilitate overlay measurements for the second layer 206 of a lot of samples 124, some embodiments of the present disclosure are directed to identifying regions/points 404 with the highest wafer-to-wafer variation, acquiring overlay measurements at these points, and using the acquired overlay measurements for feedforward control. For example, after fabricating the first layer 204 on each sample 124 of the lot of samples in step 302b, the controller 106 may be configured to identify the plurality of points 404a-404bn which exhibit the highest wafer-to-wafer variation, and select a sub-set points of the plurality of points which will be used for feedforward control. This may be further understood with reference to FIG. 5.

Figure 5:
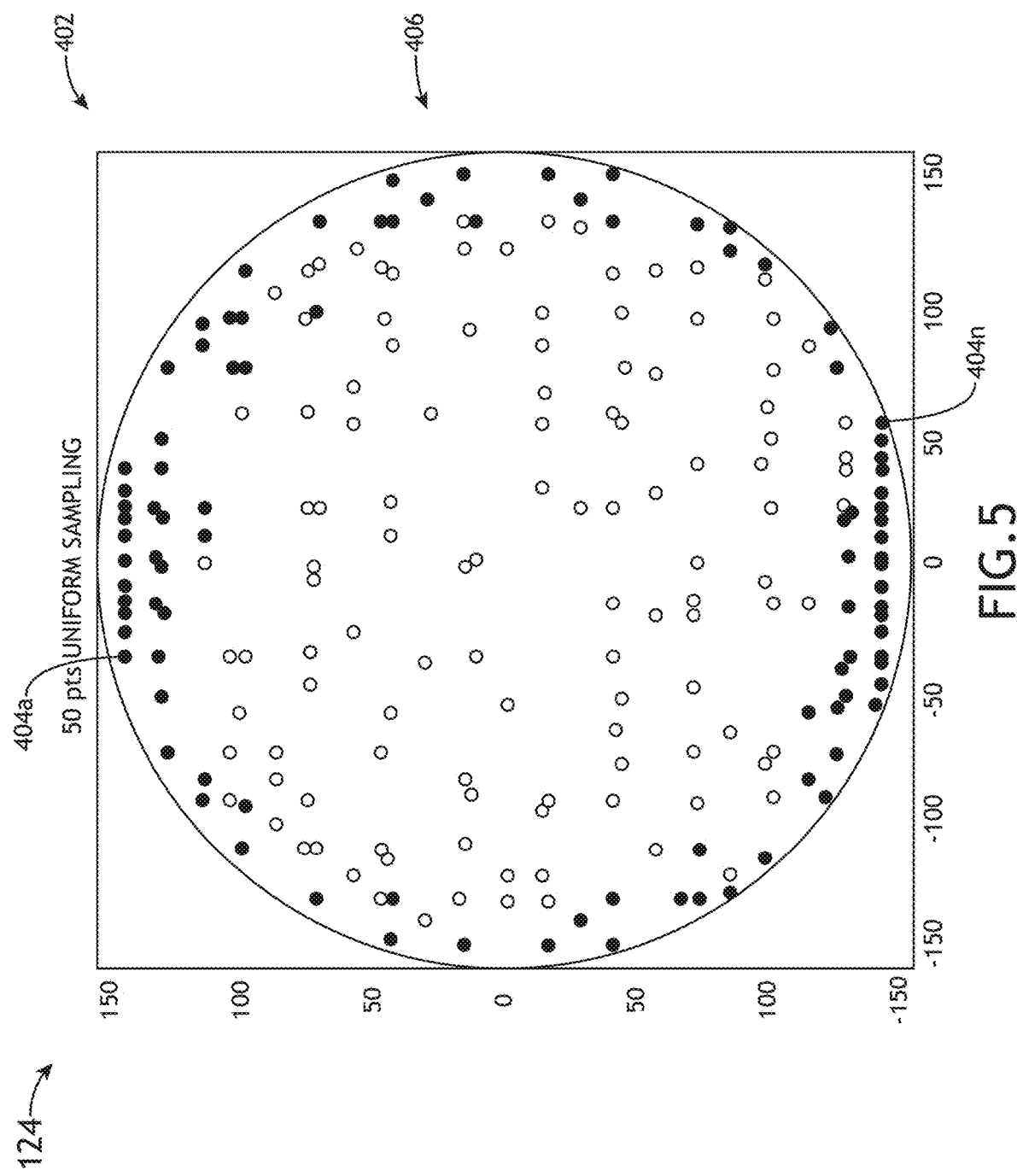
FIG. 5 illustrates a plurality of points used for edge sampling selected from a plan of record (POR) sampling map, in accordance with one or more embodiments of the present disclosure.

FIG. 5 illustrates a feedforward sampling map 406 selected from a plan of record (POR) sampling map 402, in accordance with one or more embodiments of the present disclosure.

As noted previously herein, the feedforward sampling map 406 may include a sub-set of points 404 which are selected from the POR sampling map 402. In particular, the feedforward sampling map 406 may include a sub-set of points 404 of the POR sampling map 402 which exhibit the highest wafer-to-wafer overlay variation. It has been found that the largest wafer-to-wafer overlay variations are typically found proximate to an edge of the sample 124. Thus, the feedforward sampling map 406 may include a plurality of points 404 which are proximate to the edge of the sample 124. The points of the feedforward sampling map 406 may be selected and/or identified from the POR sampling map 402 by any mathematical procedure or technique known in the art including, but not limited to, principal component analysis (PCA), root sum square (RSS) analysis, standard deviation analysis, process signature quantification (PSQ) analysis, and the like.

It is contemplated herein that utilizing the feedforward sampling map 406 including points which exhibit the most wafer-to-wafer variation may minimize the amount of overlay sampling required for feedforward correction. By reducing the number of points which must be measured for feedforward corrections, metrology throughput may be increased, metrology costs may be reduced, and the processing power required for metrology measurements may be reduced.

In some embodiments, the points 404 of the feedforward sampling map 406 may be selected in such a manner as to optimize various cost functions. For example, after identifying a set of points 404 of the POR sampling map 402 which exhibit the highest wafer-to-wafer variation, the controller 106 may narrow down the selected points to minimize the distance between points within the feedforward sampling map 406. In this example, by minimizing the distance between points within the feedforward sampling map 406, the controller 106 may reduce the stage assembly actuation time for overlay measurements, and thereby reduce the time required for metrology.

The feedforward sampling map 406 may include any number of points 404. For example, the feedforward sampling map 406 may include between twenty and fifty points. In some embodiments, the controller 106 may be configured to select a number of points 404 within the feedforward sampling map 406 which will not cause excessive metrology throughput times and/or excessive processing burdens. For example, the controller 106 may determine that a feedforward sampling map 406 may include fifty points 404 without causing excessive metrology processing burden (e.g., N=50). In this example, the controller 106 may identify one-hundred points 404 (e.g., 2N=100) of the POR sampling map 402 which exhibit the most wafer-to-wafer variation, and select fifty points 404 of the one-hundred identified points 404 which are to be included within the feedforward sampling map 406. In this example, the controller 106 may narrow down the set of one-hundred points 404 in such a manner as to minimize and/or reduce various cost functions associated with the points 404 of the feedforward sampling map 406.

After forming the first layer 204 on each sample 124 of a current lot of samples (e.g., $N^{th}$ lot of samples) in step 302 and generating the reference wafer overlay map 301 for subsequent lots in step 304, method 300 may proceed to step 306. In a step 306, the controller 106 may be configured to acquire a set of feedforward overlay measurements based on a feedforward sampling map 406 on the first layer 204 of a first set of samples of the current lot of samples ($N^{th}$ lot of samples). For example, the controller 106 may generate one or more control signals configured to cause the inspection sub-system 104 to acquire a plurality of feedforward overlay measurements and/or images of the samples 124 based on the feedforward sampling map 406, and may receive the measurements and/or images from the inspection sub-system 104. The controller 106 may additionally and/or alternatively receive the one or more feedforward overlay measurements from any source known in the art including, but not limited to, memory 110, a network, and the like. The feedforward overlay measurements collected in step 306 may include feedforward overlay measurements measuring overlay error between the first layers 204 and the reference layers 202 of the respective samples 124 of the lot of samples.

In embodiments, the system 100 may acquire a set of feedforward overlay measurements based on the feedforward sampling map 406 on every sample 124 of the lot of samples. For example, if there are twenty-five samples 124 included within a lot of samples (e.g., current/$N^{th}$ lot of samples), the controller 106 may acquire twenty-five sets of feedforward overlay measurements, one set of feedforward overlay measurements for each sample 124 within the $N^{th}$ lot. The controller 106 may be configured to store the sets of feedforward overlay measurements in memory 110.

In embodiments, the controller 106 may be configured to generate an artificial overlay vector map 303 for each sample 124 of the lot of samples. The artificial overlay vector map 303 for a particular sample 124 may be generated based on the set of feedforward overlay measurements associated with the respective sample 124. For example, if there were twenty-five samples 124 in a lot of samples, the controller 106 may be configured to generate twenty-five individual artificial overlay vector maps 303, one for each sample 124 within the lot. The controller 106 may store the generated artificial overlay vector maps 303 in memory 110.

In embodiments, the artificial overlay vector maps 303 may include feedforward overlay corrections which will be used for feedforward control in the second layer 206 of the samples 124 of the respective lot of samples. In particular, the artificial overlay vector maps 303 may be used for within-lot feedforward corrections. For example, an artificial overlay vector map 303a generated by measuring the first layer 204 of a current lot of samples ($N^{th}$ lot of samples) may be utilized for feedforward control when fabricating the second layer 206 of the current lot of samples ($N^{th}$ lot of samples). By way of another example, an artificial overlay vector map 303b generated by measuring the first layer 204 of an $N+1^{th}$ lot of samples may be utilized for feedforward control when fabricating the second layer 206 of the $N+1^{th}$ lot of samples. By way of another example, an artificial overlay vector map 303c generated measuring the first layer 204 of an $N+2^{th}$ lot of samples may be utilized for feedforward control when fabricating the second layer 206 of the $N+2^{th}$ lot of samples.

Figure 6:
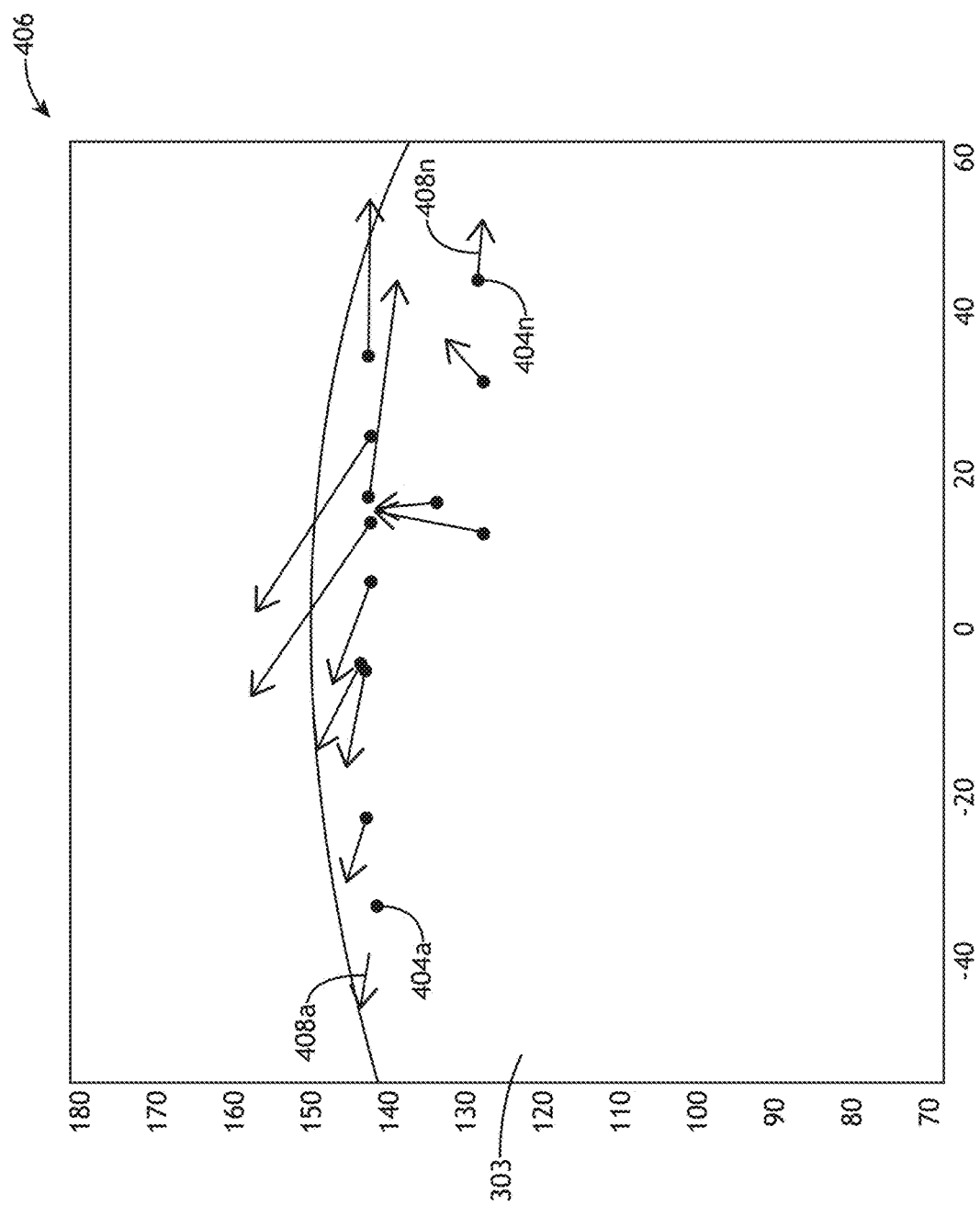
FIG. 6 illustrates a portion of an artificial overlay vector map of a sample, in accordance with one or more embodiments of the present disclosure.

FIG. 6 illustrates a portion of an artificial overlay vector map 303 of a sample 124, in accordance with one or more embodiments of the present disclosure.

In embodiments, an artificial overlay vector map 303 may include an overlay correction vector 408 for each point 404 within the feedforward sampling map 406. For example, if the feedforward sampling map 406 includes fifty points for which feedforward overlay measurements are to be acquired, an artificial overlay vector map 303 may include fifty separate overlay correction vectors 408, one for each point 404 of the feedforward sampling map 406. For instance, for every sample 124, a first point 404a of the feedforward sampling map 406 may include a first overlay correction vector 408a, and an nth point 404n of the feedforward sampling map 406 may include an nth overlay correction vector 408n. The overlay correction vectors may indicate the level of feedforward correction required to reduce/minimize the overlay error at each respective point 404 of the feedforward sampling map 406. In this regard, the larger the overlay error at a particular point 404, the larger the overlay correction vector associated with the respective point 404. It may be appreciated herein that the respective overlay correction vectors 408a-408n (and therefore artificial overlay vector maps 303) may vary between samples 124 within a lot, and need not be identical.

Reference will again be made to FIG. 3. After acquiring the feedforward overlay measurements and generating the artificial overlay vector maps 303 in step 306, method 300 may proceed to step 308. In a step 308, the controller 106 is configured to generate modified reference wafer overlay maps 307a-307n for each sample 124 of the lot of samples.

In embodiments, the controller 106 may be configured to generate the modified reference wafer overlay maps 307 based on the artificial overlay vector maps 303 of the current lot of samples (e.g., $N^{th}$ lot of samples) and a reference wafer overlay map 305 of a second layer 206 of at least one previous lot of samples (e.g., $N-1^{th}$ lot of samples, $N-2^{th}$ lot of samples, and the like). For example, when fabricating a current lot of samples ($N^{th}$ lot of samples), step 308 may include generating modified reference wafer overlay maps for each sample of the current/$N^{th}$ lot of samples based on artificial overlay vector maps 303 (step 306) of the current/$N^{th}$ lot of samples and a reference wafer overlay map 305 (step 312) of an $N-1^{th}$ lot of samples (i.e. previous lot of samples). In some embodiments, the modified reference wafer overlay maps 307a-307n may be generated by selectively modifying the reference wafer overlay map 305 of at least one previous lot of samples (e.g., $N-1^{th}$ lot of samples, $N-2^{th}$ lot of samples) with the artificial overlay vector maps 303 of the current lot of samples (e.g., $N^{th}$ lot of samples).

As noted previously herein, feedback control applied to the current lot of samples ($N^{th}$ lot of samples) may be based on feedback overlay measurements acquired on any number of previous lots of samples (e.g., $N-1^{th}$ lot of samples, $N-2^{th}$ lot of samples). This may be further understood with reference to FIG. 7.

Figure 7:
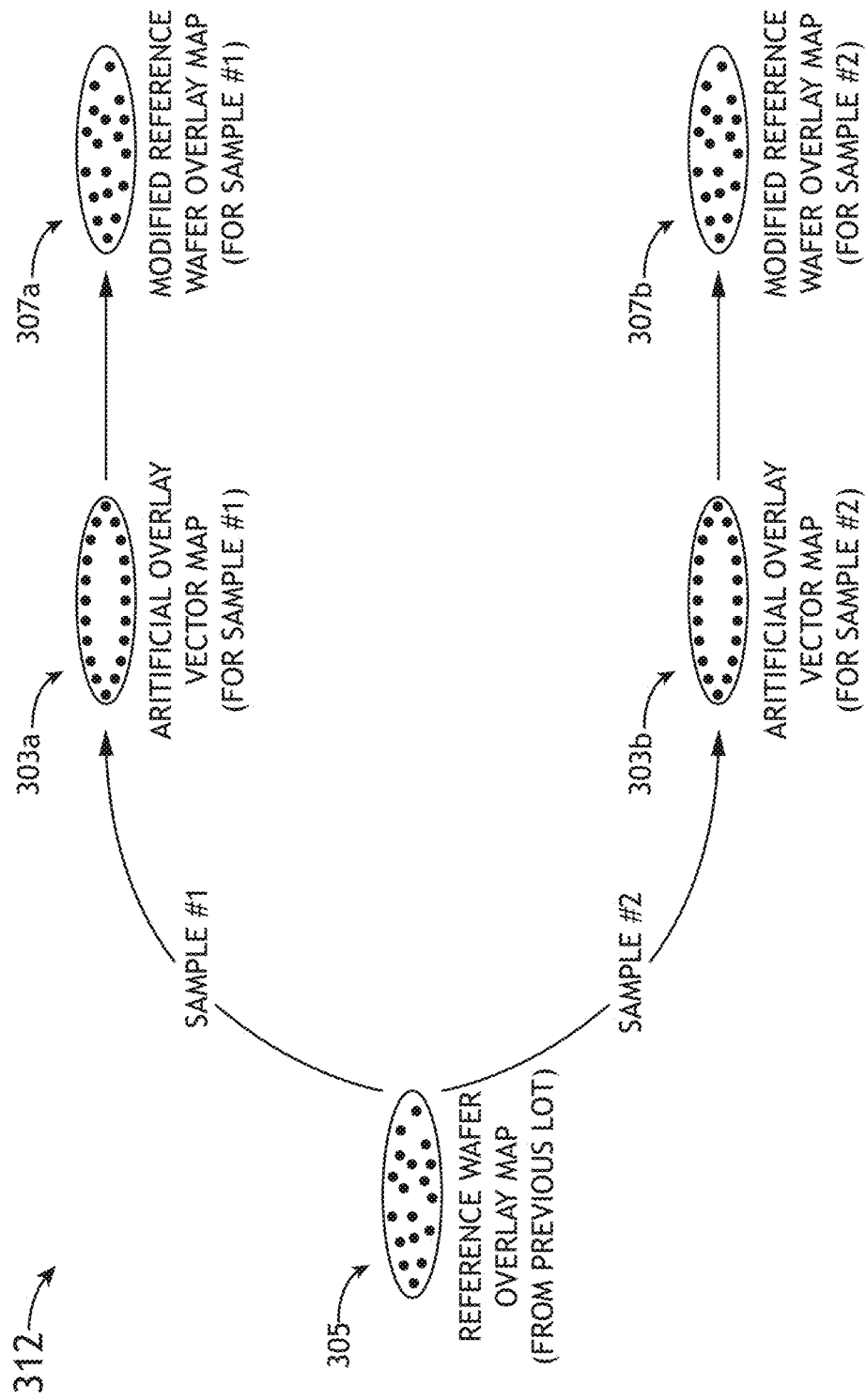
FIG. 7 illustrates a flow diagram for selectively modifying a reference wafer overlay map with artificial overlay vector maps, in accordance with one or more embodiments of the present disclosure.

FIG. 7 illustrates a flow diagram for selectively modifying a reference wafer overlay map 305 with artificial overlay vector maps 303, in accordance with one or more embodiments of the present disclosure.

In some embodiments, the second layer 206 of each respective sample 124 may be fabricated by selectively modifying a reference wafer overlay map 305 from at least one previous lot of samples (e.g., $N-1^{th}$ lot of samples, $N-2^{th}$ lot of samples, . . . , $N-n^{th}$ lot of samples) with the respective artificial overlay vector map 303 of the current lot of samples (e.g., $N^{th}$ lot of samples) to generate modified reference wafer overlay maps 307, and fabricating the second layer 206 based on the modified reference wafer overlay map 307.

For instance, when fabricating a first sample 124a of an current/$N^{th}$ lot of samples, the controller 106 may selectively modify a reference wafer overlay map 305 generated as a weighted average of an $N-1^{th}$ lot of samples and an $N-2^{th}$ lot of samples with the first artificial overlay vector map 303a associated with the first sample 124a of the current/$N^{th}$ lot of samples to generate a first modified reference wafer overlay map 307a. Subsequently, the controller 106 may cause the lithography sub-system 102 to fabricate the second layer 206 on the first sample 124a of the current/$N^{th}$ lot of samples based on the first modified reference wafer overlay map 307a.

For example, after acquiring feedback overlay measurements for an $N-1^{th}$ lot of samples, an $N-2^{th}$ lot of samples, and an $N-3^{th}$ lot of samples (e.g., first, second, and third previous lot of samples), the controller 106 may be configured to generate a reference wafer overlay map 305 to be used for feedback control on the current lot of samples ($N^{th}$ lot of samples) using a weighted average for each of the respective previous lots of examples. For instance, for each point 404 within the reference wafer overlay map 305 of the current lot, the controller 106 may be configured to calculate an overlay of the particular point as $((0.4*N-1^{th})+(0.3*N-2^{th})+(0.2*N-3^{th}))$. In this example, the more recent measurements acquired on the more recently inspected lots are weighted more heavily than older lots.

It is noted herein that the controller 106 may be configured to manually and/or automatically select any number or combination of previous lots to be used when generating the reference wafer overlay map 305 to be used on the current lot. Additionally, the controller 106 may be configured to use any mathematical technique or weighting schemes known in the art in order to combine feedback overlay measurements from one or more lots into a single reference wafer overlay map 305. For example, the controller 106 may be configured to utilize weighted averages, moving averages (MA), exponentially weighted moving averages (EWMA), linearly weighted moving averages (LWM), and the like.

In embodiments, the reference wafer overlay map 305 from at least one previous lot of samples may be selectively modified by each respective artificial overlay vector map 303a-303n of the current lot of samples by applying the overlay correction vectors 308 associated with each point 404 of the feedforward sampling map 406 within the reference wafer overlay map 305. For instance, when fabricating a first sample 124a of a current lot of samples (an $N^{th}$ lot of samples), the controller 106 may selectively modify the reference wafer overlay map 305 generated as a weighted average of a set of feedback overlay measurements acquired at one or more previous lots of samples by applying the overlay correction vectors 308 associated with each point 404 within the first artificial overlay vector map 303a associated with the first sample 124a of the current/$N^{th}$ lot of samples to generate a first modified reference wafer overlay map 307a. Subsequently, the controller 106 may cause the lithography sub-system 102 to fabricate the second layer 206 on the first sample 124a of the current/$N^{th}$ lot of samples based on the first modified reference wafer overlay map 307a.

By modifying the reference wafer overlay map 305 of a previous lot of samples based on the artificial overlay vector maps 303a-303n, the generated modified reference wafer overlay maps 307 may be identical to the reference wafer overlay map 305 of the previous lot except for the points associated with the feedforward sampling map (and overlay correction vectors 308). In this regard, the same overlay measurement values may be applied at each point 404 for each sample 124, except for the overlay differences associated with each of the points 404 within the feedforward sampling map measured within the respective lot. In other words, the modified reference wafer overlay maps 307 used to fabricate the second layers in step 312 may exhibit the same overlay corrections at every point 404 except for the points within the feedforward sampling map.

After calculating modified reference wafer overlay maps 307 in step 308, method 300 may proceed to step 310. In a step 310, a second layer 206 is fabricated on the samples 124 of the current lot of samples based on the modified reference wafer overlay maps 307. In this regard, the controller 106 may fabricate each of the second layers 206 of the current lot of samples based on the reference wafer overlay map 305 of the second layer 206 of a previous lot of samples and the respective artificial overlay vector map 303 of the current lot of samples. For example, the controller 106 may generate control signals configured to cause a lithography tool of the lithography sub-system 102 to fabricate the second layer 206 in step 308b based on a first modified reference wafer overlay map 307, which is generated based on reference wafer overlay map 305 of the second layer 206 and the respective artificial overlay vector map 303.

For instance, when fabricating a first sample 124a of the $N^{th}$ lot of samples, the controller 106 may cause the lithography sub-system 102 to fabricate the second layer 206a of the first sample 124a based on the reference wafer overlay map 305 (from step 312) of an $N-1^{th}$ lot of samples and the artificial overlay vector map 303a associated with the first sample 124a (from step 306) of the $N^{th}$ lot of samples. By way of another example, when fabricating a second sample 124b of the $N^{th}$ lot of samples, the controller 106 may cause the lithography sub-system 102 to fabricate the second layer 206a of the second sample 124b based on the reference wafer overlay map 305 (from step 312) of an $N-1^{th}$ lot of samples and the artificial overlay vector map 303b associated with the second sample 124b (from step 306) of the $N^{th}$ lot of samples.

In this regard, the reference wafer overlay map 305 formed based on the POR sampling map 402 (e.g., feedback overlay measurements) of the second layer 206 in a previous lot may be used for feedback control in order to fabricate the second layers 206 on the samples 124 of the current lot of samples. Conversely, the artificial overlay vector maps 303 formed based on the feedforward sampling map 406 (e.g., feedforward overlay measurements) of the first layer 204 in the current lot may be used for feedforward control in order to fabricate the rest of the second layers 206 on the samples 124 of the current lot of samples.

When fabricating the second layer 206 of the samples 124 of the current lot of samples in step 310, the controller 106 may utilize the modified reference wafer overlay maps 307 and run one or more high-order overlay modeling schemes for each wafer in order to identify and correct the wafer-to-wafer variations. The controller 106 may be configured to perform any overlay modeling processes or models known in the art including, but not limited to, an extrapolated field-by-field correction model, a high-order Zernike model, and the like.

In a step 312, the samples 124 including the second layer 206 (fabricated in step 310) of the current lot are inspected. For example, the controller 106 may cause the inspection sub-system 104 to acquire a plurality of measurements (e.g., feedback overlay measurements) and/or images of one or more samples 124, and may receive the measurements and/or images from the inspection sub-system 104. The controller 106 may additionally and/or alternatively receive the one or more feedback overlay measurements from any source known in the art including, but not limited to, memory 110, a network, and the like. The feedback overlay measurements collected in step 312 may be feedback overlay measurements measuring overlay error on the samples of the current lot of samples between the second layers 206 and the reference layers 202 of the respective samples. The controller 106 may store the feedback overlay measurements in memory 110.

In embodiments, the controller 106 may cause the inspection sub-system 104 (or other image/measurement source) to acquire the feedback overlay measurements in step 312 based on the POR sampling map 402. For example, the controller 106 may utilize the same POR sampling map 402 in steps 304 and 312. In this regard, the points 404 used for the feedforward sampling map 406 in step 306 may include a sub-set of points 404 selected from the points of the POR sampling map 402 used in step 312.

In another embodiment, the controller 106 may be configured to generate a reference wafer overlay map 305 of the second layer 206 (Layer 2) based on the feedback overlay measurements acquired in step 312. The reference wafer overlay map 305 may include a reference map of the second layer 204 of the reference samples fabricated in step 310, and may be used to carry out feedback overlay corrections in subsequent lots of samples. For example, when carrying out inspection of step 312 on a current/$N^{th}$ lot of samples, the controller 106 may generate a reference wafer overlay map 305 which may be used for feedback overlay corrections when fabricating a second layer 206 on one or more subsequent lots of samples (e.g., $N+1^{th}$ lot of samples, $N+2^{th}$ lot of samples, ..., $N+n^{th}$ lot of samples). By way of another example, when carrying out inspection of step 312 on an $N+1^{th}$ lot of samples, the controller 106 may generate a reference wafer overlay map 305 which may be used for feedback overlay corrections when fabricating a second layer 206 on samples of an $N+2^{th}$ lot of samples.

The reference wafer overlay map 305 may represent calculated average overlays expected for the current and/or subsequent lots of samples, and may include overlay error values associated with each point 404 within the POR sampling map 402. The reference wafer overlay map 305 generated in step 312 may represent the overlay signatures of the lot of samples seen in high-volume manufacturing. Additionally, the use of the reference wafer overlay map 305 to fabricate the second layer 206 of samples 124 of subsequent lots of samples may facilitate the determination of rework on-product overlay (OPO).

It is contemplated herein that embodiments of the present disclosure may enable improved overlay control. In particular, embodiments of the present disclosure may enable wafer-by-wafer feedforward overlay correction control, as opposed to conventional overlay control systems which may only provide lot-by-lot and/or stage-by-stage feedforward capabilities. Additionally, it has been found that the system 100 and method 300 of the present disclosure may result in up to twenty-five feedforward corrections per lot, which is much improved over the maximum two corrections per lot provided by conventional overlay control systems. Accordingly, embodiments of the present disclosure have been found to effectively reduce within-lot (e.g., wafer-by-wafer) overlay variations as compared to conventional overlay control systems. Furthermore, as noted previously herein, embodiments of the present disclosure may enable improved overlay control while simultaneously reducing the number of overlay measurements which must be acquired at the first layer 204. In effect, the system 100 and method 300 may enable faster metrology throughput and reduced metrology and fabrication times.

Figure 8:
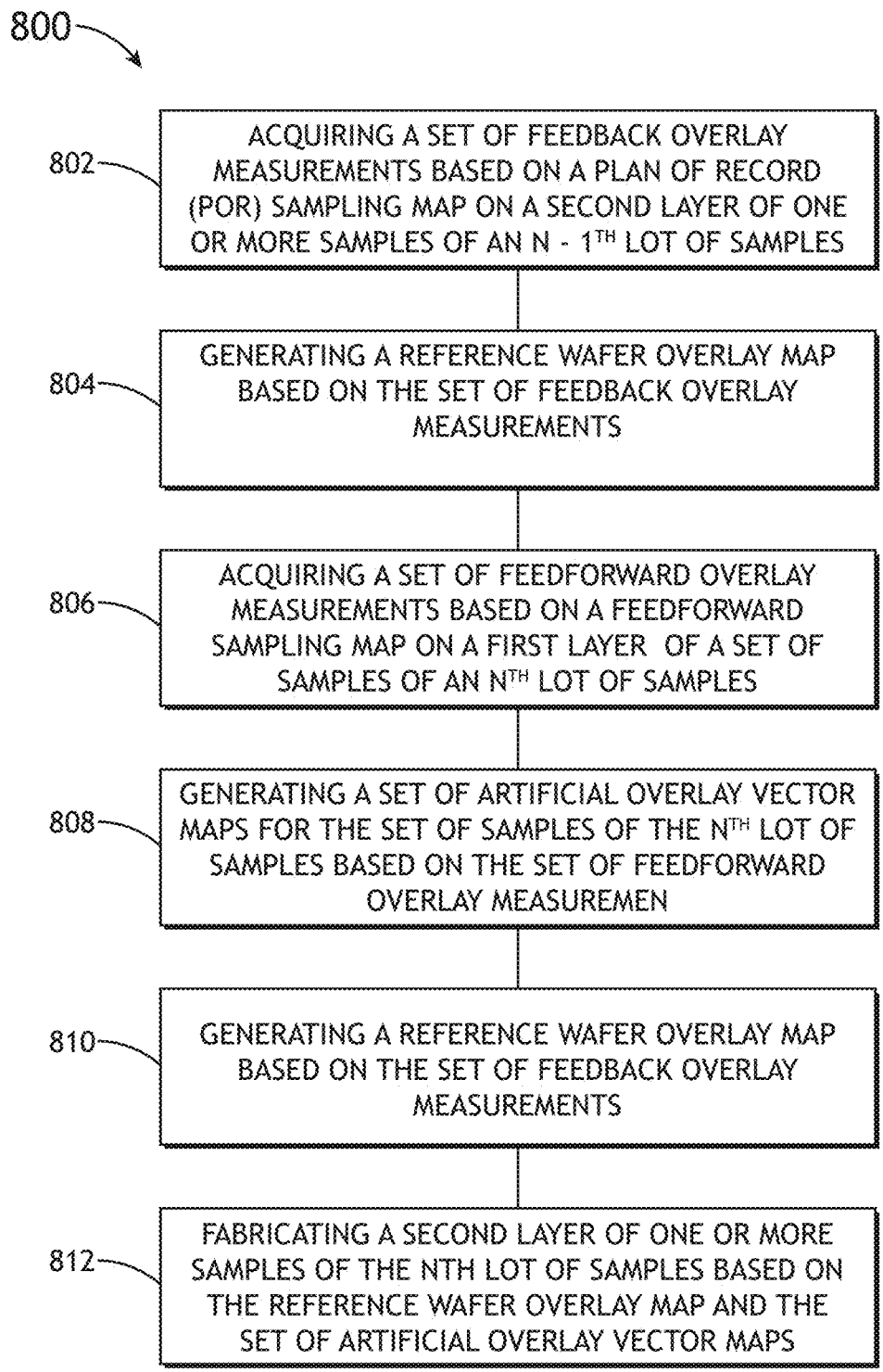
FIG. 8 is a flowchart of an overlay control method, in accordance with one or more embodiments of the present disclosure.

FIG. 8 is a flowchart of an overlay control method 800, in accordance with one or more embodiments of the present disclosure. It is noted herein that the steps of method 800 may be implemented all or in part by system 100. It is further recognized, however, that the method 800 is not limited to the system 100 in that additional or alternative system-level embodiments may carry out all or part of the steps of method 800.

In a step 802, a set of feedback overlay measurements based on a plan of record (POR) sampling map on a second layer of one or more samples of at least one previous lot of samples (e.g., $N-1^{th}$ lot of samples) are acquired. For example, as shown in step 312, the controller 106 may cause the inspection sub-system 104 to acquire a plurality of measurements (e.g., feedback overlay measurements) and/or images of one or more samples 124 of an $N-1^{th}$ lot of samples and/or an $N-2^{th}$ lot of samples based on the POR sampling map 402. In this example, the $N-1^{th}$ lot of samples may be regarded as the first "previous" lot of samples, and the $N-2^{th}$ lot of samples may be regarded as the second "previous" lot of samples.

In a step 804, a reference wafer overlay map based on the set of feedback overlay measurements is generated. For example, the controller 106 may generate a reference wafer overlay map 305 for the at least one previous lot of samples (e.g. N−1$^{th}$ lot of samples, N−1$^{th}$ lot of samples) based on the set of feedback overlay measurements acquired in step 802 (step 312).

In a step 806, a set of feedforward overlay measurements based on a feedforward sampling map on a first layer of a set of samples of a current lot of samples (e.g., N$^{th}$ lot of samples). For example, as shown in step 306, the controller 106 may be configured to acquire a set of feedforward overlay measurements based on a feedforward sampling map 406 on the first layer 204 of a first set of samples of an current/N$^{th}$ lot of samples. For instance, the controller 106 may generate one or more control signals configured to cause the inspection sub-system 104 to acquire a plurality of feedforward overlay measurements and/or images of the samples 124 based on the feedforward sampling map 406, and may receive the measurements and/or images from the inspection sub-system 104. In this example, the N$^{th}$ lot of samples may be regarded as the "current" lot of samples.

In a step 808, a set of artificial overlay vector maps for the set of samples of the current/N$^{th}$ lot of samples are generated based on the set of feedforward overlay measurements. For example, as shown in step 306, the controller 106 may be configured to generate an artificial overlay vector map 303 for each sample 124 of the current/N$^{th}$ lot of samples. The artificial overlay vector map 303 for a particular sample 124 may be generated based on the set of feedforward overlay measurements associated with the respective sample 124 of the current/N$^{th}$ lot of samples. In embodiments, an artificial overlay vector map 303 may include an overlay correction vector 408 for each point 404 within the feedforward sampling map 406. For example, if the feedforward sampling map 406 includes 50 points for which feedforward overlay measurements are to be acquired, an artificial overlay vector map 303 may include 50 separate overlay correction vectors 408, one for each point 404 of the feedforward sampling map 406.

In a step 810, a second layer of one or more samples of the current/N$^{th}$ lot of samples is fabricated based on the reference wafer overlay map and the set of artificial overlay vector maps. For example, as shown in steps 308 and 310, a second layer of the one or more samples of the current/N$^{th}$ lot of samples may be fabricated based on the artificial overlay vector maps 303 of the N$^{th}$ lot of samples (current lot of samples) and the reference wafer overlay map 305 based on the at least one previous lot of samples (e.g., N−1$^{th}$ lot of samples, N−1$^{th}$ lot of samples).

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:
1. An overlay control system, comprising:
   a controller including one or more processors, the one or more processors configured to execute a set of program instructions stored in memory, the set of program instructions configured to cause the one or more processors to:
      acquire a set of feedback overlay measurements based on a plan of record (POR) sampling map on a second layer of one or more samples of at least one previous lot of samples, wherein the POR sampling map includes a plurality of points;
      generate a reference wafer overlay map based on the set of feedback overlay measurements;
      acquire a set of feedforward overlay measurements based on a feedforward sampling map on a first layer of a set of samples of a current lot of samples;
      apply an overlay correction vector associated to each point of the feedforward sampling map within the reference wafer overlay map to generate a set of artificial overlay vector maps for the set of samples of the current lot of samples based on the set of feedforward overlay measurements; and
      generate one or more control signals configured to cause a lithography tool to fabricate a second layer of one or more samples of the current lot of samples based on the reference wafer overlay map and the set of artificial overlay vector maps.

2. The overlay control system of claim 1, wherein the set of artificial overlay vector maps comprise feedforward overlay corrections.

3. The overlay control system of claim 1, wherein the reference wafer overlay map is used to carry out feedback overlay corrections.

4. The overlay control system of claim 1, wherein the controller is configured to generate an artificial overlay vector map for each sample of the set of samples of the current lot of samples.

5. The overlay control system of claim 1, wherein the controller is configured to cause the lithography tool to fabricate a second layer of a first sample of the current lot of samples based on the reference wafer overlay map and the set of artificial overlay vector maps by:
   selectively modifying the reference wafer overlay map with a first artificial overlay vector map to generate a first modified reference wafer overlay map; and
   generating one or more control signals configured to cause the lithography tool to fabricate a second layer of the first sample of the current lot of samples based on the modified reference wafer overlay map.

6. The overlay control system of claim 5, wherein the controller is configured to cause the lithography tool to fabricate a second layer of an additional sample of the current lot of samples based on the reference wafer overlay map and the artificial overlay vector maps by:

selectively modifying the reference wafer overlay map with an additional artificial overlay vector map to generate an additional modified reference wafer overlay map; and
generating one or more control signals configured to cause the lithography tool to fabricate a second layer of the additional sample of the current lot of samples based on the additional modified reference wafer overlay map.

7. The overlay control system of claim 1, wherein the artificial overlay vector map includes an overlay correction vector for each point of the plurality of points.

8. The overlay control system of claim 1, wherein the plurality of points of the feedforward sampling map comprises a plurality of points proximate to an edge of the first set of samples.

9. The overlay control system of claim 1, wherein the plurality of points of the feedforward sampling map comprise a sub-set of points selected from the POR sampling map.

10. The overlay control system of claim 9, wherein the controller is configured to select the plurality of points of the feedforward sampling map by:
identifying a sub-set of points of the POR sampling map which exhibit the highest sample-to-sample overlay variation; and
selecting the sub-set of points as the plurality of points of the feedforward sampling map.

11. The overlay control system of claim 10, wherein the controller is configured to identify the sub-set of points of the POR sampling map which exhibit the highest sample-to-sample overlay variation via one or more principal component analysis processes.

12. The overlay control system of claim 1, wherein the POR sampling map includes a set of points which are dispersed across the entirety of each sample of the lot of samples.

13. The overlay control system of claim 1, wherein the first set of samples comprises each sample of the lot of samples.

14. The overlay control system of claim 1, wherein the second layer of the lot of samples is fabricated on top of the first layer of the lot of samples.

15. The overlay control system of claim 1, wherein the set of feedforward overlay measurements of the first layer and the set of feedback overlay measurements of the second layer are measured with respect to a single reference layer.

16. The overlay control system of claim 1, wherein the controller is further configured to:
acquire a set of feedback overlay measurements based on the POR sampling map on the first layer of a set of samples of the Nth lot of samples;
generate an additional reference wafer overlay map based on the set of feedback overlay measurements; and
generate one or more control signals configured to cause the lithography tool to fabricate a first layer of one or more samples of an N+1$^{th}$ lot of samples based at least in part on the additional reference wafer overlay map.

17. The overlay control system of claim 1, wherein the at least one previous lot of samples comprises a first previous lot of samples and a second previous lot of samples,
wherein the set of feedback overlay measurements include feedback overlay measurements on the first previous lot of samples and the second previous lot of samples,
wherein the reference wafer overlay map is generated as a weighted average of the feedback overlay measurements on the first previous lot of samples and the feedback overlay measurements on the second previous lot of samples.

18. An overlay control system, comprising:
a lithography tool; and
a controller communicatively coupled to the lithography tool, the controller including one or more processors, the one or more processors configured to execute a set of program instructions stored in memory, the set of program instructions configured to cause the one or more processors to:
acquire a set of feedback overlay measurements based on a plan of record (POR) sampling map on a second layer of one or more samples of an at least one previous lot of samples;
generate a reference wafer overlay map based on the set of feedback overlay measurements;
acquire a set of feedforward overlay measurements based on a feedforward sampling map on a first layer of a set of samples of a current lot of samples, wherein the feedforward sampling map includes a plurality of points;
apply an overlay correction vector to each point of the feedforward sampling map within the reference wafer overlay map to generate a set of artificial overlay vector maps for each sample of the current lot of samples based on the set of feedforward overlay measurements; and
generate one or more control signals configured to cause the lithography tool to fabricate a second layer of each sample of the current lot of samples based on the reference wafer overlay map and the set of artificial overlay vector maps.

19. A method for feedforward and feedback overlay control comprising:
acquiring a set of feedback overlay measurements based on a plan of record (POR) sampling map on a second layer of one or more samples of at least one previous lot of samples;
generating a reference wafer overlay map based on the set of feedback overlay measurements;
acquiring a set of feedforward overlay measurements based on a feedforward sampling map on a first layer of a set of samples of a current lot of samples, wherein the feedforward sampling map includes a plurality of points;
applying an overlay correction vector to each point of the feedforward sampling map within the reference wafer overlay map to generate a set of artificial overlay vector maps for the set of samples of the current lot of samples based on the set of feedforward overlay measurements; and
generating one or more control signals configured to cause a lithography tool to fabricate a second layer of one or more samples of the current lot of samples based on the reference wafer overlay map and the set of artificial overlay vector maps.

* * * * *

UNITED STATES PATENT AND TRADEMARK OFFICE
CERTIFICATE OF CORRECTION

| | |
|---|---|
| PATENT NO. | : 11,221,561 B2 |
| APPLICATION NO. | : 16/742209 |
| DATED | : January 11, 2022 |
| INVENTOR(S) | : Onur Nihat Demirer, Fatima Anis and Mark D. Smith |

It is certified that error appears in the above-identified patent and that said Letters Patent is hereby corrected as shown below:

In the Claims

Column 22, Line 30, Claim 1:
Delete "to" and insert --with--

Column 24, Line 28, Claim 18:
Delete "to" and insert --associated with--

Column 24, Line 51, Claim 19:
Delete "to" and insert --associated with--

Signed and Sealed this
Sixth Day of February, 2024

Katherine Kelly Vidal
Director of the United States Patent and Trademark Office